(12) United States Patent
Baek et al.

(10) Patent No.: US 10,684,698 B2
(45) Date of Patent: Jun. 16, 2020

(54) DISPLAY DEVICE AND METHOD OF FABRICATING THE SAME

(71) Applicant: SAMSUNG DISPLAY CO., LTD., Yongin-si, Gyeonggi-Do (KR)

(72) Inventors: Gyung Min Baek, Yongin-si (KR); Hyun Eok Shin, Gwacheon-si (KR); Ju Hyun Lee, Seongnam-si (KR); Joon Yong Park, Gunpo-si (KR); Sang Won Shin, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 61 days.

(21) Appl. No.: 15/813,331

(22) Filed: Nov. 15, 2017

(65) Prior Publication Data
US 2019/0004616 A1  Jan. 3, 2019

(30) Foreign Application Priority Data
Jun. 30, 2017  (KR) .......................... 10-2017-0083728

(51) Int. Cl.
*G06F 3/02* (2006.01)
*G06F 3/0488* (2013.01)
(Continued)

(52) U.S. Cl.
CPC ............ *G06F 3/0202* (2013.01); *G06F 3/044* (2013.01); *G06F 3/0412* (2013.01);
(Continued)

(58) Field of Classification Search
CPC ...... G06F 3/0202; G06F 3/0488; G06F 3/044; G06F 2203/04103; G06F 3/0412;
(Continued)

(56) References Cited

U.S. PATENT DOCUMENTS

| 9,345,144 B2 * | 5/2016 | Cok ......................... G06F 3/044 |
| 2013/0341651 A1 * | 12/2013 | Kim ..................... H01L 31/0232 |
| | | 257/84 |

(Continued)

FOREIGN PATENT DOCUMENTS

| KR | 101567331 | 11/2015 |
| KR | 1020150126885 | 11/2015 |

(Continued)

OTHER PUBLICATIONS

Search Report dated Jul. 20, 2018 issued by the EPO for European Patent Application No. 18155106.0 which was filed Feb. 5, 2018. (11 pages).

(Continued)

*Primary Examiner* — Vinh T Lam
(74) *Attorney, Agent, or Firm* — F. Chau & Associates, LLC

(57) ABSTRACT

An input sensing unit includes a first metal pattern layer including a plurality of first conductive lines extending in a first direction. A first insulating layer is disposed on the first metal pattern layer. A second metal pattern layer is positioned above the first insulating layer and includes a plurality of second conductive lines extending in a second direction intersecting the first direction. A second insulating layer is disposed on the second metal pattern layer. A sensing electrode is disposed on the second insulating layer and is electrically connected to the second metal pattern layer through a contact hole defined in the second insulating layer. An anti-reflection pattern layer is disposed on the first and second metal pattern layers to overlap the first and second metal pattern layers along a direction orthogonal to an upper surface of the anti-reflection pattern layer.

20 Claims, 11 Drawing Sheets

(51) Int. Cl.
*H03K 17/96* (2006.01)
*H04M 1/23* (2006.01)
*H05K 3/18* (2006.01)
*H01L 27/32* (2006.01)
*G06F 3/044* (2006.01)
*H01L 51/52* (2006.01)
*G06F 3/041* (2006.01)

(52) U.S. Cl.
CPC .......... *G06F 3/0488* (2013.01); *H01L 27/323* (2013.01); *H01L 27/3216* (2013.01); *H01L 51/5281* (2013.01); *H03K 17/96* (2013.01); *H04M 1/233* (2013.01); *H05K 3/182* (2013.01); *G06F 2203/04103* (2013.01)

(58) Field of Classification Search
CPC ....... H03K 17/96; H04M 1/233; H05K 3/182; H01L 51/5281; H01L 27/3216; H01L 27/323
See application file for complete search history.

(56) References Cited

U.S. PATENT DOCUMENTS

| | | | | |
|---|---|---|---|---|
| 2014/0048829 | A1* | 2/2014 | Shin | G02F 1/136209 |
| | | | | 257/91 |
| 2014/0362043 | A1 | 12/2014 | Chu et al. | |
| 2014/0367652 | A1* | 12/2014 | Cho | H01L 27/3244 |
| | | | | 257/40 |
| 2015/0079372 | A1* | 3/2015 | Tsai | G06F 3/044 |
| | | | | 428/216 |
| 2015/0236047 | A1* | 8/2015 | Kim | H01L 27/124 |
| | | | | 345/174 |
| 2015/0311477 | A1* | 10/2015 | Cho | H01L 51/5284 |
| | | | | 257/40 |
| 2015/0317014 | A1* | 11/2015 | Miyake | G06F 3/044 |
| | | | | 345/174 |
| 2016/0133198 | A1 | 5/2016 | Jeong et al. | |
| 2016/0178821 | A1* | 6/2016 | Choi | G02F 1/133502 |
| | | | | 349/194 |
| 2016/0291709 | A1* | 10/2016 | Hwang | G06F 3/041 |
| 2016/0378224 | A1* | 12/2016 | Kwon | H01L 51/5256 |
| | | | | 345/174 |
| 2017/0003777 | A1 | 1/2017 | Akhavan Fomani et al. | |
| 2017/0123565 | A1 | 5/2017 | Li | |
| 2017/0168616 | A1* | 6/2017 | Feng | G06F 3/044 |
| 2017/0260428 | A1* | 9/2017 | Kim | B32B 27/08 |
| 2017/0277324 | A1* | 9/2017 | Dan | G06F 3/0412 |
| 2017/0351364 | A1 | 12/2017 | Kim et al. | |
| 2018/0120971 | A1* | 5/2018 | Lee | G06F 3/044 |
| 2019/0013495 | A1 | 1/2019 | Kim et al. | |

FOREIGN PATENT DOCUMENTS

| | | |
|---|---|---|
| KR | 10-2017-0042532 | 4/2017 |
| KR | 1020170039050 | 4/2017 |
| KR | 1020170042532 | 4/2017 |
| KR | 10-2019-0004863 | 1/2019 |
| WO | 2016155351 | 6/2016 |

OTHER PUBLICATIONS

Office Action dated Nov. 27, 2018 issued by the EPO for European Patent Application No. 18155106.0, (10 pages).

* cited by examiner

DISPLAY DEVICE AND METHOD OF FABRICATING THE SAME

CROSS-REFERENCE TO RELATED APPLICATION

This application claims priority under 35 U.S.C. § 119 to Korean Patent Application No. 10-2017-0083728, filed on Jun. 30, 2017, in the Korean Intellectual Property Office, the disclosure of which is incorporated by reference herein in its entirety.

1. TECHNICAL FIELD

Exemplary embodiments of the present invention relate to a display device, and more particularly to a method of fabricating the same.

2. DISCUSSION OF RELATED ART

Various display devices used in multimedia devices such as televisions, mobile phones, tablet computers, navigation systems and game machines are being developed. A display device may include a keyboard or a mouse as an input device. In addition, the display device may include a touch panel as an input device. The touch panel may be an element for acquiring coordinate information of a touch position of a user. Recently, research has been conducted on a fingerprint sensor capable of acquiring fingerprint information of a user.

Sensing fingerprint information may include more precise sensing than simple touch information. Thus, a fingerprint sensor may be designed to detect a more minute current change than a general touch panel.

SUMMARY

An exemplary embodiment of the present invention provides an input sensing unit having reduced reflection of external light, a display device including the input sensing unit, and a method of fabricating the display device.

According to an exemplary embodiment of the present invention, an input sensing unit includes a first metal pattern layer including a plurality of first conductive lines extending in a first direction. A first insulating layer is disposed on the first metal pattern layer. A second metal pattern layer is positioned above the first insulating layer and includes a plurality of second conductive lines extending in a second direction intersecting the first direction. A second insulating layer is disposed on the second metal pattern layer. A sensing electrode is disposed on the second insulating layer and is electrically connected to the second metal pattern layer through a contact hole defined in the second insulating layer. An anti-reflection pattern layer is disposed on the first and second metal pattern layers to overlap the first and second metal pattern layers along a direction orthogonal to an upper surface of the anti-reflection pattern layer. The anti-reflection pattern layer includes a metal oxide having an empirical formula of $Mo_aX_bO_c$, where a and c are rational numbers greater than zero, b is a rational number equal to or greater than zero, and X includes at least one element selected from tantalum (Ta), vanadium (V), niobium (Nb), zirconium (Zr), tungsten (W), hafnium (Hf), titanium (Ti), or rhenium (Re).

According to an exemplary embodiment of the present invention, a display device includes a display panel on which a plurality of pixels are defined. An anti-reflection layer is disposed on the display panel. An input sensing unit is disposed on the anti-reflection layer. The input sensing unit includes a first metal pattern layer including a plurality of first conductive lines extending in a first direction. The input sensing unit includes a second metal pattern layer positioned above the first metal pattern layer and including a plurality of second conductive lines extending in a second direction intersecting the first direction. The input sensing unit includes an anti-reflection pattern layer disposed on the first and second metal pattern layers to overlap the first and second metal pattern layers along a direction orthogonal to an upper surface of the anti-reflection pattern layer. The anti-reflection pattern layer includes a metal oxide having an empirical formula of $Mo_aX_bO_c$, where a and c are rational numbers greater than zero, b is a rational number equal to or greater than zero, and X includes at least one element selected from tantalum (Ta), vanadium (V), niobium (Nb), zirconium (Zr), tungsten (W), hafnium (Hf), titanium (Ti), or rhenium (Re).

According to an exemplary embodiment of the present invention, a method of manufacturing an input sensing unit includes forming an active pattern layer and an active insulating layer which substantially covers the active pattern layer on a base layer. The method includes forming a first metal layer and an anti-reflection material layer which substantially covers the first metal layer on the active insulating layer. The method includes forming a first metal pattern layer which includes a plurality of first conductive lines extending in a first direction and a first anti-reflection pattern layer which has the same pattern as the first metal pattern layer by substantially simultaneously etching the first metal layer and the anti-reflection material layer. The method includes forming a first insulating layer on the active insulating layer to cover the first metal pattern layer and the first anti-reflection pattern layer. The method includes forming a second metal layer and an anti-reflection material layer which covers the second metal layer on the first insulating layer. The method includes forming a second metal pattern layer which includes a plurality of second conductive lines extending in a second direction intersecting the first direction and a second anti-reflection pattern layer which has the same pattern as the second metal pattern layer by substantially simultaneously etching the second metal layer and the anti-reflection material layer. Part of the first metal pattern layer overlaps at least part of the active pattern layer along a direction orthogonal to an upper surface of the base layer. Part of the second metal pattern layer overlaps at least part of the active pattern layer along the direction orthogonal to the upper surface of the base layer. The anti-reflection material layer includes a metal oxide having an empirical formula of $Mo_aX_bO_c$, where a and c are rational numbers greater than zero, b is a rational number equal to or greater than zero, and X includes at least one element selected from tantalum (Ta), vanadium (V), niobium (Nb), zirconium (Zr), tungsten (W), hafnium (Hf), titanium (Ti), or rhenium (Re).

BRIEF DESCRIPTION OF THE DRAWINGS

The above and other aspects and features of the present invention will become more apparent by describing in detail exemplary embodiments thereof with reference to the accompanying drawings, in which.

DETAILED DESCRIPTION

Figure 1:
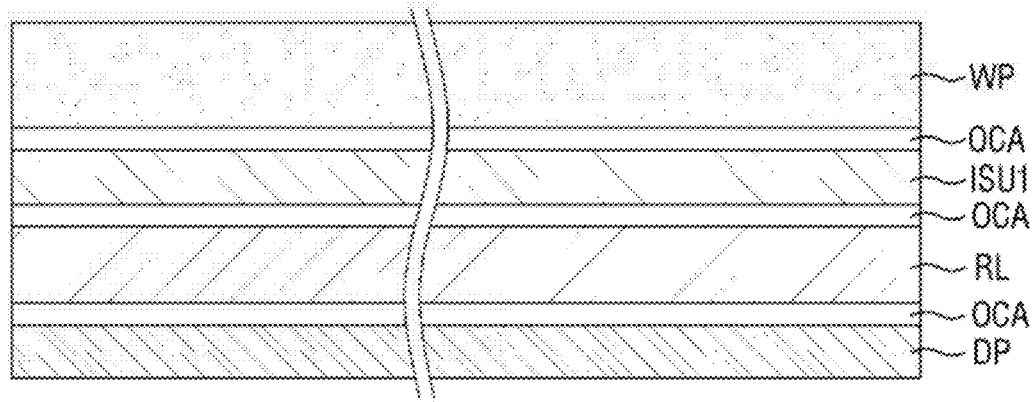
FIG. 1 is a cross-sectional view illustrating a stacked structure of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

It will be understood that when a component, such as a layer, a film, a region, or a plate, is referred to as being "on" another component, the component may be directly on the other component or intervening components may be present.

FIG. 1 is a cross-sectional view illustrating a stacked structure of a display device according to an exemplary embodiment of the present invention.

Referring to FIG. 1, the display device may include a display panel DP, an anti-reflection layer RL, an input sensing unit ISU1, and a window layer WP.

Each of the display panel DP, the anti-reflection layer RL, the input sensing unit ISU1 and the window layer WP may be positioned above a base layer (e.g., base layer BL described in more detail below with reference to FIG. 4). The base layer may include a synthetic resin film, a composite film, or a glass substrate. However, exemplary embodiments of the present invention are not limited thereto. As an example, the display panel DL, the anti-reflection layer RL, the input sensing unit ISU1 and the window layer WP may be sequentially formed above a base surface through a continuous process.

According to an exemplary embodiment of the present invention, each of the display panel DP, the anti-reflection layer RL, the input sensing unit ISU1 and the window layer WP may be formed on a separate base layer and then combined using the adhesive members OCA.

The display panel DP, the anti-reflection layer RL, the input sensing unit ISU1 and the window layer WP may each be attached to each other by an adhesive member OCA positioned between adjacent layers of the display panel DP, the anti-reflection layer RL, the input sensing unit ISU1 and the window layer WP. The adhesive members OCA may include a conventional adhesive or a gluing agent. The adhesive members OCA described with reference to FIG. 1 may each be an optically clear adhesive member; however, exemplary embodiments of the present invention are not limited thereto.

The display panel DP is an element for generating an image, and a plurality of pixels that transmit or emit light upward in the drawing may be defined on the display panel DP (e.g., when viewed in a plan view). The display panel DP may be, but is not limited to, a light-receiving display panel DP that transmits light received from a separate backlight unit or uses the light as an excitation light source or a self-luminous display panel DP that emits light by itself using an organic light emitting diode.

The display panel DP may be a thin-film transistor substrate on which an organic light emitting diode and an encapsulation film for sealing the organic light emitting diode are disposed, and the thin-film transistor substrate may have a structure in which a gate electrode is disposed on an active layer including low-temperature polysilicon. However, exemplary embodiments of the present invention are not limited thereto.

The anti-reflection layer RL may be disposed on the display panel DP. As an example, when the anti-reflection layer RL is manufactured in the form of a separate panel including a base layer, it may be attached onto the display panel DP by the adhesive member OCA.

The anti-reflection layer RL may reduce external light reflected from the display panel DP (e.g., light reflected by metallic elements of the display panel DP). The anti-reflection layer RL may include a polarizer and/or a retarder.

As an example, the polarizer may include a film or a liquid crystal coating. As an example, the retarder may include a film or a liquid crystal coating and may include a $\lambda/2$ retarder and/or a $\lambda/4$ retarder. The film type may include a stretch-type synthetic resin film, and the liquid crystal coating type may include liquid crystals arranged in a predetermined direction.

The polarizer and the retarder may include a protective film. The protective film may be defined as the base layer of the anti-reflection layer RL. However, exemplary embodiments of the present invention are not limited thereto, and the polarizer or the retarder itself may be defined as the base layer of the anti-reflection layer RL.

The anti-reflection layer RL may include color filters. The color filters may be arranged in a predetermined manner. As an example, the color filters may be arranged in a manner corresponding to the arrangement of emission colors of the pixels included in the display panel DP.

The anti-reflection layer RL may include a destructive interference structure. For example, the destructive interference structure may include a first reflective layer and a second reflective layer disposed on different layers. First light and second light reflected by the first reflection layer and the second reflection layer, respectively, may be canceled out, thus reducing the external light reflectance.

The input sensing unit ISU1 may be disposed on the anti-reflection layer RL. As an example, when the input sensing unit ISU1 is manufactured in the form of a separate panel including a base layer, it may be attached onto the anti-reflection layer RL by the adhesive member OCA.

The input sensing unit ISU1 is an element for acquiring coordinate information of an external input. As an example, the input sensing unit ISU1 may be a touch sensing unit that senses a user's touch or a fingerprint sensing unit that senses fingerprint information of a user's finger.

The input sensing unit ISU1 according to an exemplary embodiment of the present invention may be a fingerprint sensing unit that senses fingerprint information. The fingerprint sensing unit may include sensing electrodes having a width of several μm to several hundreds of μm, and the touch sensing unit may include sensing electrodes having a width of several mm to several tens of mm. The fingerprint sensing unit may include a thin-film transistor including an active layer, a gate electrode, and a data electrode, which may be used to obtain relatively accurate coordinate information. Thus, the fingerprint sensing unit can sense not only general touch information but also fingerprint information composed of relatively fine coordinate information. The fingerprint sensing unit will be described in more detail below.

The window layer WP may be disposed on the input sensing unit ISU1. When the window layer WP is manufactured in the form of a separate panel including a base layer, it may be attached onto the input sensing unit ISU1 by the adhesive member OCA.

The window layer WP may include a glass substrate and/or a synthetic resin film. The window layer WP is not limited to a single layer. The window layer WP may include two or more films bonded together with an adhesive member.

The window layer WP may further include a functional coating layer disposed on the window layer WP. The functional coating layer may include an anti-fingerprint layer, an anti-reflection layer, and/or a hard coating layer.

When the input sensing unit ISU1 is configured as a fingerprint sensing unit according to an exemplary embodiment of the present invention, the window layer WP may be disposed directly on the fingerprint sensing unit ISU1 with only the adhesive member OCA disposed between the fingerprint sensing unit ISU1 and the window layer WP. Thus, a separate anti-reflection member for reducing the external light reflectance of metallic elements included in the fingerprint sensing unit ISU1 need not be disposed between the fingerprint sensing unit ISU1 and the window layer WP.

An anti-reflection member such as a polarizer may be as thick as several tens of μm. Since sensing fingerprint information may involve the acquisition of much finer and more precise coordinate information than sensing general touch information, if the anti-reflection member is stacked on the fingerprint sensing unit ISU1, the fingerprint information might not be accurately sensed. Thus, a separate anti-reflection member might not be positioned on the fingerprint sensing unit ISU1 to increase the accuracy of acquisition of the fingerprint information, and the reflection of external light by the fingerprint sensing unit ISU1 (e.g., by metallic elements included in the fingerprint sensing unit ISU1) may be blocked by an anti-reflection pattern layer which will be described in more detail below.

A surface of the display device on which an image is viewed may be a substantially flat surface. However, exemplary embodiments of the present invention are not limited thereto, and the surface on which an image is viewed may also be a curved surface or a three-dimensional surface. The display device may be a rigid display device. However, exemplary embodiments of the present invention are not limited thereto, and the display device may also be a flexible display device.

Figure 2:
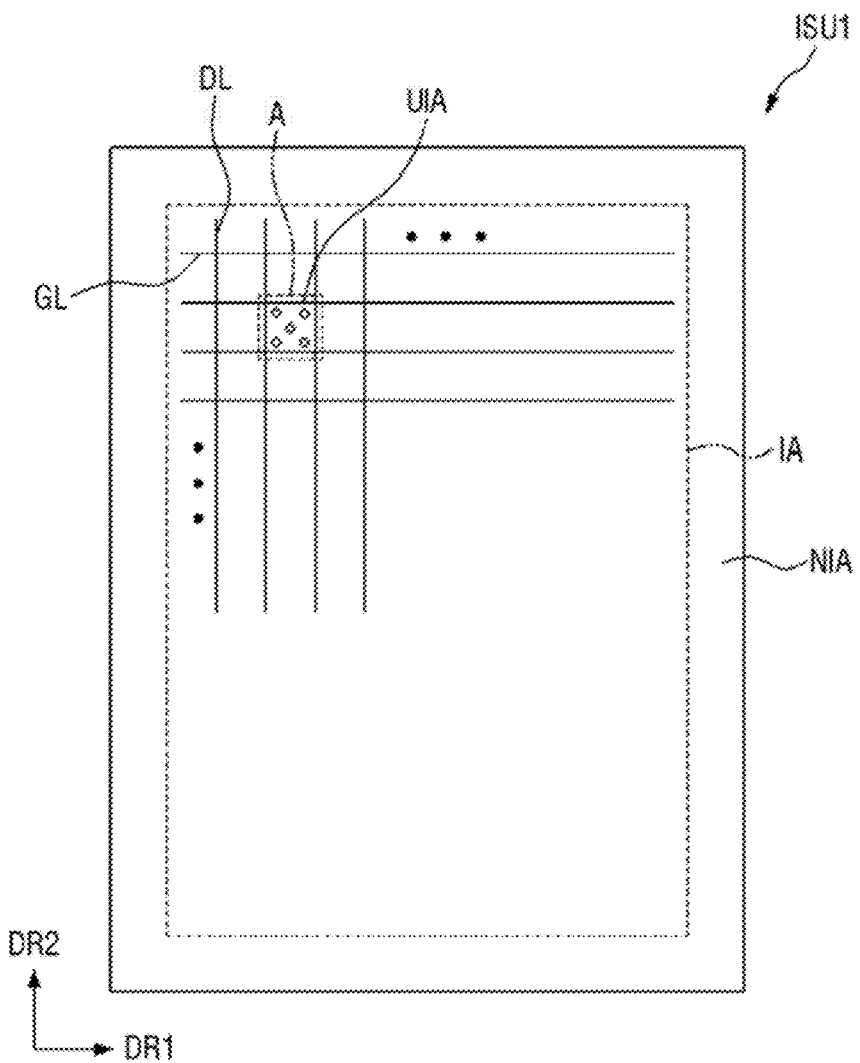
FIG. 2 is a plan view of an input sensing unit of a display device according to an exemplary embodiment of the present invention.

FIG. 2 is a plan view of an input sensing unit of a display device according to an exemplary embodiment of the present invention.

Referring to FIG. 2, the input sensing unit ISU1 may include a sensing area IA which includes a plurality of gate lines GL and a plurality of data lines DL and a non-sensing area NIA which is positioned outside the sensing area IA to surround the sensing area IA.

The gate lines GL may extend in a first direction DR1 and may be arranged parallel to each other. The data lines DL may extend in a second direction DR2 intersecting the first direction DR1 and may be arranged parallel to each other. The first direction DR1 and the second direction DR2 may be perpendicular to each other.

The gate lines GL and the data lines DL may intersect each other to be arranged in a matrix shape (e.g., when viewed in a plan view). Areas surrounded by the gate lines GL and the data lines DL, may be defined as a unit sensing area UIA. As an example, the unit sensing area UIA may be an area surrounded by two adjacent gate lines GL and two adjacent data lines DL, and a plurality of unit sensing areas UIA may be defined in the sensing area IA.

The input sensing unit ISU1 may include a plurality of sensing electrodes SE, and the sensing electrodes SE may each be positioned to correspond to a unit sensing area UIA in a one-to-one manner. Each unit sensing area UIA may overlap 1 to 30 pixels of the plurality of pixels of the display panel DP positioned under the unit sensing area UIA. As an example, 1 to 30 pixels may be included in each unit sensing area UIA. The unit sensing areas UIA will be described in more detail below.

The gate lines GL and the data lines DL may extend up to the non-sensing region NIA and may be connected to signal pads (not illustrated) disposed in the non-sensing area NIA. The signal pads may be elements for transmitting a driving signal, or a control signal to the gate lines GL and the data lines DL.

The sensing area IA may be, but is not limited to, an area overlapping at least part of an area where an image is generated in the display panel DP positioned under the sensing area IA or an area completely overlapping the area where an image is generated in the display panel DP along a direction orthogonal to an upper surface of the display panel DP.

The input sensing unit ISU1 according to an exemplary embodiment of the present invention may be a fingerprint sensing unit for recognizing fingerprint information, and the sensing area IA may be an area for acquiring coordinates of a fingerprint pattern by sensing fingerprint information.

The input sensing unit ISU1 according to an exemplary embodiment of the present invention will be described in more detail below.

Figure 3:
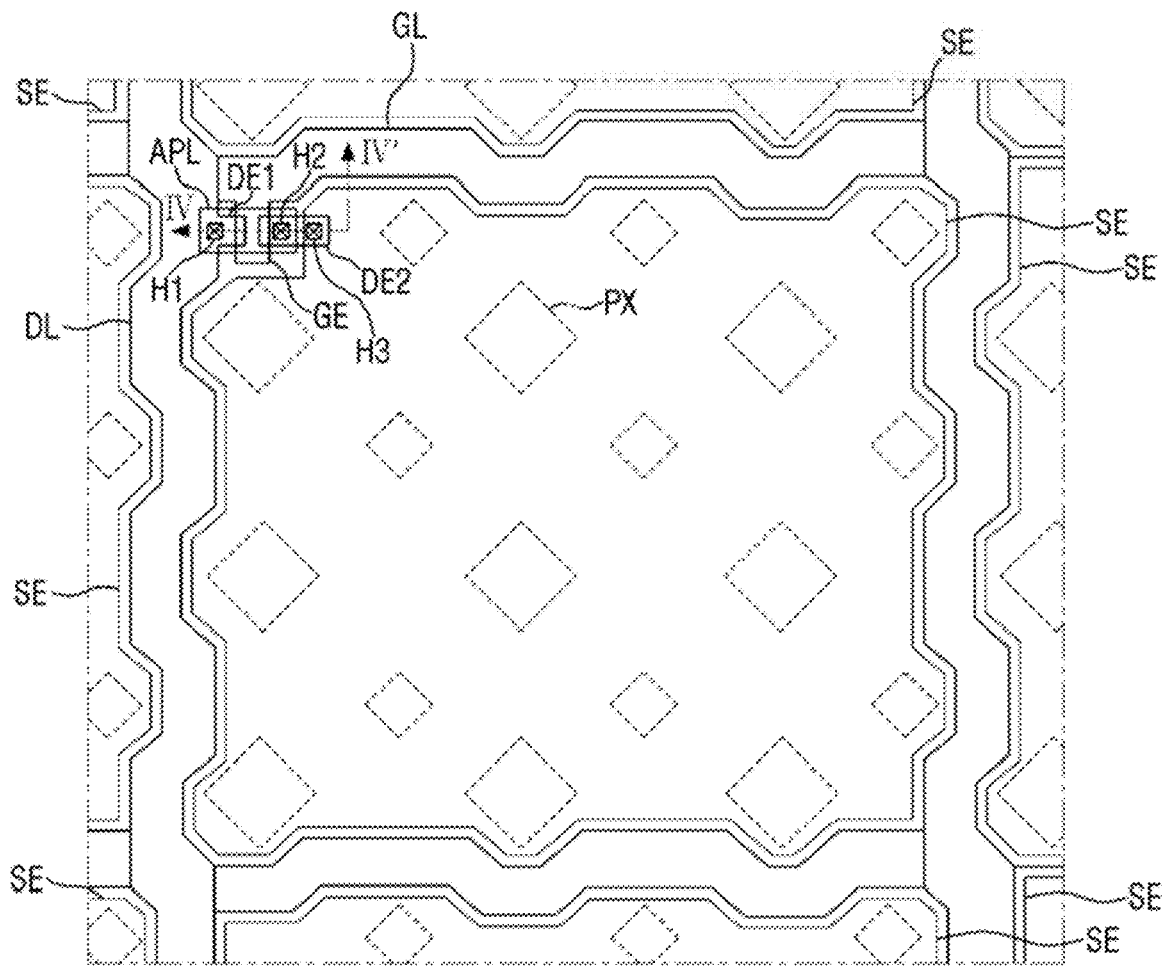
FIG. 3 is an enlarged view of a portion 'A' of the input sensing unit illustrated in FIG. 2.

FIG. 3 is an enlarged view of a portion 'A' of the input sensing unit illustrated in FIG. 2. FIG. 4 is a cross-sectional view of the input sensing unit, taken along the line IV-IV' of FIG. 3.

Figure 4:
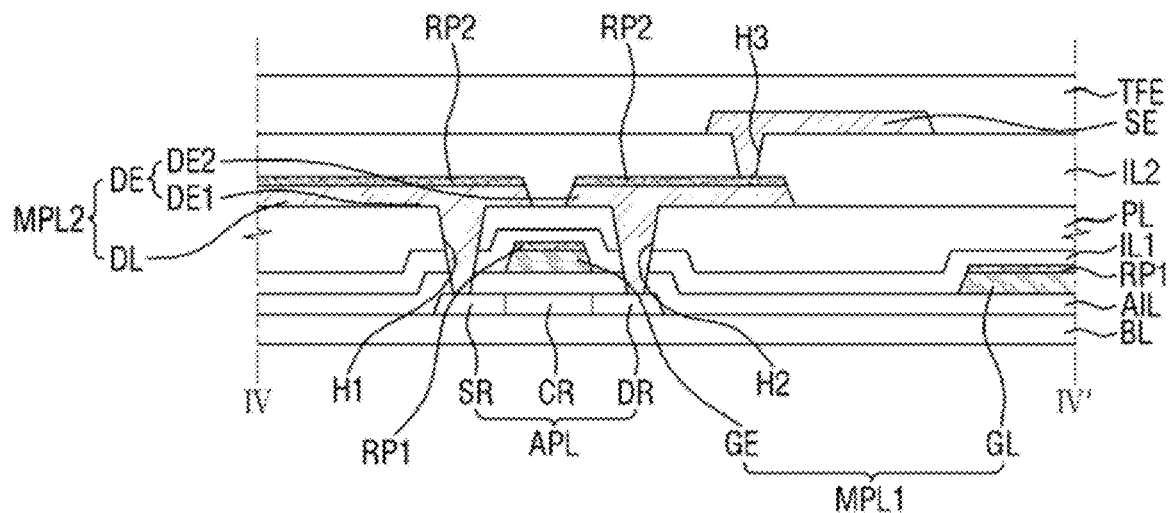
FIG. 4 is a cross-sectional view of the input sensing unit, taken along the line IV-IV' of FIG. 3.

Referring to FIGS. 3 and 4, the input sensing unit ISU1 may include a base layer BL, an active pattern layer APL, an active insulating layer AIL, a first metal pattern layer MPL1, a first insulating layer IL1, a second metal pattern layer MPL2, a second insulating layer IL2, and a plurality of sensing electrodes SE.

The first metal pattern layer MPL1 and the second metal pattern layer MPL2 may each include a plurality of gate lines GL and a plurality of data lines DL. Each unit sensing area UIA defined by the gate lines GL and the data lines DL may overlap a plurality of pixels PX along a direction orthogonal to an upper surface of the base layer BL. Referring to FIG. 3, according to an exemplary embodiment of the present invention, 18 pixels PX are included in one unit sensing area UIA. However, exemplary embodiments of the present invention are not limited thereto, and 1 to 30 pixels PX, for example, may also be included in one unit sensing area UIA.

The base layer BL, may provide a space in which the active pattern layer APL and the active insulating layer AIL are disposed and may support elements of the input sensing unit ISU1 including the active pattern layer APL and the active insulating layer AIL. The base layer BL may be a glass substrate or a synthetic resin film such as polyimide and may be attached onto the anti-reflection layer RL disposed under the base layer BL by the adhesive member OCA.

The base layer BL can also be omitted, and the elements of the input sensing unit ISU1 can be formed directly on the anti-reflection layer RL through a continuous process. In this case, a base surface for supporting the active pattern layer APL and the active insulating layer AIL may be an upper surface of the anti-reflection layer RL.

The active pattern layer APL may be disposed directly on the base layer BL. The active pattern layer APL, may include a semiconductor, for example, polycrystalline silicon, amorphous silicon or metal oxide. As an example, the active pattern layer APL may include, but is not limited to, low-temperature polysilicon.

The active pattern layer API, may include a channel region CR and a source region SR and a drain region DR positioned on opposite sides of the channel region CR. The channel region CR may be an intrinsic semiconductor undoped with an impurity, and the source region SR and the drain region DR may be an impurity semiconductor doped with a conductive impurity.

The active insulating layer AIL may be disposed on the base layer BL and may substantially cover an upper surface of the active pattern layer APL facing away from the base layer BL. The active insulating layer AIL may insulate the active pattern layer APL and a gate electrode GE from each other.

The active insulating layer AIL may include at least one of silicon oxide ($SiO_x$), silicon nitride ($SiN_x$), silicon oxynitride ($SiO_xN_y$), titanium oxide ($TiO_2$), or aluminum oxide ($Al_2O_3$). Thus, the active insulating layer AIL may have an insulating property and may serve as a refractive index matching layer that reduces the reflection of external light by a metal layer or a transparent conductive layer.

The first metal pattern layer MPL1 may be disposed on the active insulating layer AIL. The first metal pattern layer MPL1 may include the gate lines GL extending in the first direction DR1 and the gate electrode GE branching from some of the gate lines GL into each unit sensing area UIA.

The first metal pattern layer MPL1 may include at least one of molybdenum (Mo), aluminum (Al), or titanium (Ti). As an example, the first metal pattern layer MPL1 may include molybdenum. The first metal pattern layer MPL1 may be formed as a single layer or a multilayer including one or more of the above metals. However, exemplary embodiments of the present invention are not limited thereto, and the first metal pattern layer MPL1 may include a material other than the above metals.

The first metal pattern layer MPL1 need not overlap the pixels PX along the direction orthogonal to the upper surface of the base layer BL. The gate lines GL of the first metal pattern layer MPL1 may be arranged in a zigzag manner to avoid the pixels PX (see, e.g., FIG. 3). However, exemplary embodiments of the present invention are not limited thereto, and the gate lines GL may be arranged in a straight line when the widths of the gate lines GL are sufficiently small to avoid the pixels PX. Alternatively, the gate lines GL may be arranged in a straight line depending on the arrangement of the pixels PX.

A first anti-reflection pattern layer RP1 may be disposed on the first metal pattern layer MPL1. The first anti-reflection pattern layer RP1 may be disposed directly on the first metal pattern layer MPL1 to cover an upper surface of the first metal pattern layer MPL1 facing away from the base layer BL. The first anti-reflection pattern layer RP1 may have a same pattern as the first metal pattern layer MPL1 to overlap the first metal pattern layer MPL1 along the direction orthogonal to the upper surface of the base layer BL.

The first anti-reflection pattern layer RP1 may be disposed on the first metal pattern layer MPL1; however, exemplary embodiments of the present invention are not limited thereto, and the first anti-reflection pattern layer RP1 may be positioned to cover at least part of side surfaces of the first metal pattern layer MPL1, may be positioned under the first metal pattern layer MPL1, or may be positioned to cover at least part of a lower surface of the first metal pattern layer MPL1 facing the base layer BL.

In the display device according to an exemplary embodiment of the present invention, a separate anti-reflection member might not be disposed on the input sensing unit ISU1 as described above. Thus, an element capable of blocking the reflection of external light by a metallic element such as the first metal pattern layer MPL1 may be included in the input sensing unit ISU1. Thus, a layer (e.g., such as the first anti-reflection pattern layer RP1) including a material capable of reducing or eliminating the reflection of external light may be positioned to cover the upper surface of the first metal pattern layer MPL1 facing away from the base layer BL, thus reducing or eliminating the reflection of external light.

The first anti-reflection pattern layer RP1 may include a metal oxide having an empirical formula of $Mo_aX_bO_c$, where X may include at least one of tantalum (Ta), vanadium (V), niobium (Nb), zirconium (Zr), tungsten (W), hafnium (Hf), titanium (Ti), or rhenium (Re). The empirical formula expresses a ratio of atoms in the metal oxide, and a, b, and c may represent percentages of molybdenum atoms, X atoms, and oxygen atoms. Thus, a, b, and c may be rational numbers equal to or greater than zero, and the sum of a, b, and c may be one. As an example, the metal oxide may be a material based on molybdenum oxide, in which case a and c may be rational numbers greater than zero. However, exemplary embodiments of the present invention are not limited thereto, and a, b, and c may also represent relative proportions of the molybdenum atoms, the X atoms, and the oxygen atoms. In an exemplary embodiment of the present invention, a:c=1:0.1 to 10, and a+b+c:b=1:0.01 to 0.07.

The metal oxide having the above empirical formula may be in a state where a molybdenum oxide and an oxide of an X element are mixed, in a state where the molybdenum oxide is doped with the X element, in a state where molybdenum, the X element and oxygen are bonded to each other, or in a state where the above states are mixed.

Since the metal oxide having the above empirical formula has an extinction coefficient ($\alpha$) of 3000 $cm^{-1}$ or more, it can effectively block the reflection of external light by the first metal pattern layer MPL1. Further, since the solubility of the metal oxide in water may be relatively low, erosion does not occur during the etching of the first anti-reflection pattern layer RP1 itself or in a subsequent process such as etching or washing using water. This can increase the efficiency of the manufacturing process. In addition, the metal oxide has a small potential difference from molybdenum, aluminum or titanium that can be included in the first metal pattern layer MPL1. Thus, the possibility of corrosion due to oxidation/reduction is relatively low even when the metal oxide directly contacts the first metal pattern layer MPL1. In addition, since the metal oxide is a conductive material having a resistance value of about 3000Ω/☐ based on a thickness of 500 Å, it can electrically connect the sensing electrodes SE and the second metal pattern layer MPL2 which will be described in more detail below.

The proportion of the X atoms in the metal oxide having the above empirical formula may be from 1% to 7%. If the proportion of the X atoms is 1% or more, the solubility of the metal oxide in water can be effectively reduced. If the proportion of the X atoms is 7% or less, the low reflection property of the metal oxide may be maintained while the etching property of the metal oxide is also maintained at a desired level. In this case, a ratio of a+b+c to b may be, but is not limited to, 1:0.01 to 0.07.

The first anti-reflection pattern layer RP1 including the metal oxide may have a thickness of from about 300 Å to about 700 Å. When the thickness of the first anti-reflection pattern layer RP1 is within the range of about 300 Å to 700 Å, the average reflectance of the display device including the input sensing unit ISU1 may be less than 10%, and the reflectance of the display device for a wavelength of 550 nm may be less than 5%.

The first anti-reflection pattern layer RP1 including the metal oxide may have a refractive index and/or thickness that satisfies nd=λ/4, where n is the refractive index of the first anti-reflection pattern layer RP1, d is the thickness of the first anti-reflection pattern layer RP1, and λ is a target wavelength for reflection prevention. When the above formula is satisfied, the first anti-reflection pattern layer RP1 has an optical destructive interference thickness. Thus, the first anti-reflection pattern layer RP1 can effectively reduce light reflection. Here, λ may be set to, but not limited to, 550 nm, which is the most sensitive wavelength to the human eye.

The first insulating layer IL1 may be positioned above the active insulating layer AIL to cover an upper surface of the first metal pattern layer MPL1 facing away from the base layer BL. The first insulating layer IL1 may insulate the first metal pattern layer MPL1 and the second metal pattern layer MPL2 from each other.

The first insulating layer IL1 may include at least one of silicon oxide ($SiO_x$), silicon nitride ($SiN_x$), silicon oxynitride ($SiO_xN_y$), titanium oxide ($TiO_2$), or aluminum oxide ($Al_2O_3$). Thus, the first insulating layer IL1 may have an insulating property and may serve as a refractive index matching layer that reduces or eliminates the reflection of external light by a metal layer or a transparent conductive layer.

A planarization film PL may be disposed on the first insulating layer IL1. However, the planarization film PL can be omitted.

The second metal pattern layer MPL2 may be positioned above the first insulating layer IL1. When the planarization film PL is provided, the second metal pattern layer MPL2 may be disposed on the planarization film PL. The second metal pattern layer MPL2 may include the data lines DL extending in the second direction DR2 intersecting the first direction DR1, a source electrode DE1 branching from at least some of the data lines DL into each unit sensing area UIA, and a drain electrode DE2 separated from the source electrode DE1 (e.g., when viewed in a plan view).

The source/drain electrode DE may be electrically connected to the active pattern layer APL through contact holes H1 and H2 formed in the active insulating layer AIL and the first insulating layer IL1. As an example, the source electrode DE1 may be connected to the source region SR of the active pattern layer APL, and the drain electrode DE2 may be connected to the drain region DR of the active pattern layer APL. When the planarization film PL is provided, the contact holes H1 and H2 may also be formed in the planarization film PL.

The second metal pattern layer MPL2 may include at least one of molybdenum (Mo), aluminum (Al), or titanium (Ti). As an example, the second metal pattern layer MPL2 may include aluminum and titanium. The second metal pattern layer MPL2 may be formed as a single layer or a multilayer including one or more of the above metals. However, exemplary embodiments of the present invention are not limited thereto, and the second metal pattern layer MPL2 may include a material other than the above metals.

The second metal pattern layer MPL2 might not overlap the pixels PX along the direction orthogonal to the upper surface of the base layer BL. The data lines DL of the second metal pattern layer MPL2 may also be arranged in a zigzag manner to avoid the pixels PX (see, e.g., FIG. 3). However, exemplary embodiments of the present invention are not limited thereto, and the data lines DL may be arranged in a straight line when the widths of the data lines DL are sufficiently small to avoid the pixels PX.

A second anti-reflection pattern layer RP2 may be disposed on the second metal pattern layer MPL2. The second anti-reflection pattern layer RP2 may be disposed directly on the second metal pattern layer MPL2 to cover the upper surface of the second metal pattern layer MPL2 facing away from the base layer BL. The second anti-reflection pattern layer RP2 may have a same pattern as the second metal pattern layer MPL2 to overlap the second metal pattern layer MPL2 along the direction orthogonal to the upper surface of the base layer BL.

The second anti-reflection pattern layer RP2 may cover at least part of side surfaces of the second metal pattern layer MPL2, may be positioned under the second metal pattern layer MPL2, or may be positioned to cover at least part of a lower surface of the second metal pattern layer MPL2.

The second anti-reflection pattern layer RP2 may block the refection of external light by the second metal pattern layer MPL2 and may include a metal oxide having an empirical formula of $Mo_aX_bO_c$. The second anti-reflection pattern layer RP2 is substantially the same as the first anti-reflection pattern layer RP1 described above, and thus duplicative descriptions may be omitted below.

The first anti-reflection pattern layer RP1 and the second anti-reflection pattern layer RP2 may include, but are not limited to, a same material.

The second insulating layer IL2 may be positioned above the first insulating layer IL1 to cover an upper surface of the second metal pattern layer MPL2 facing away from the base layer BL. When the planarization film PL is provided, the second insulating layer IL2 may be disposed on the planarization film PL. The second insulating layer IL2 may insulate the second metal pattern layer MPL2 from each of the sensing electrodes SE.

The second insulating layer IL2 may include at least one of silicon oxide ($SiO_x$), silicon nitride ($SiN_x$), silicon oxynitride ($SiO_xN_y$), titanium oxide ($TiO_2$), or aluminum oxide ($Al_2O_3$). Thus, the second insulating layer IL2 may have an insulating property and may serve as a refractive index matching layer that reduces or eliminates the reflection of external light by a metal layer or a transparent conductive layer.

The sensing electrodes SE may be disposed on the second insulating layer IL2. Each sensing electrode SE may be disposed at a position corresponding to a positioned of one unit sensing area UIA.

The sensing electrodes SE may include a transparent conductive material. For example, the sensing electrodes SE may include transparent conductive oxide (TCO) such as indium tin oxide (ITO), indium zinc oxide (IZO), zinc oxide (ZnO), or indium tin zinc oxide (ITZO). Each of the sensing electrodes SE may be formed as a single layer or a multi-layer including one or more of the above materials.

Each of the sensing electrodes SE may be electrically connected to the second metal pattern layer MPL2 through a contact hole 113 formed in the second insulating layer IL2. As an example, each of the sensing electrodes SE may contact the second anti-reflection pattern layer RP2 disposed on the drain electrode DE2 of the second metal pattern layer MPL2. Since the second anti-reflection pattern layer RP2 is a conductive material as described above, each of the sensing electrodes SE may be electrically connected to the second metal pattern layer MPL2 by the second anti-reflection pattern layer RP2. However, exemplary embodiments of the present invention are not limited thereto, and the second anti-reflection pattern layer RP2 may be partially etched to expose the surface of the second metal pattern layer MPL2 facing away from the base layer BL when the contact hole H3 is formed in the second insulating layer IL2. Thus, each of the sensing electrodes SE may directly contact the second metal pattern layer MPL2.

Each sensing electrode SE may have an area that substantially covers a corresponding unit sensing area UIA in a plan view. As an example, one sensing electrode SE may overlap 1 to 30 pixels PX of the plurality of pixels PX defined in the display panel DP. However, exemplary embodiments of the present invention are not limited thereto, and each sensing electrode SE may be positioned only in a part of a corresponding unit sensing area UIA.

An encapsulation layer TFE may be disposed on the second insulating layer IL2 to cover each of the sensing electrodes SE. The encapsulation layer TFE may include an organic material or an insulating material to protect the elements of the input sensing unit ISU1 from outside air, moisture, or impact. The encapsulation layer TFE may be an encapsulation film or an encapsulation substrate.

The input sensing unit ISU1 may include a reference electrode positioned under sensing electrode SE. The reference electrode may be separated from sensing electrode SE by at least one insulating layer and may overlap at least part of the sensing electrode SE along the direction orthogonal to the upper surface of the base layer BL.

The reference electrode may be part of the first metal pattern layer MPL1. As an example, the first metal pattern layer MPL1 may include the reference electrode separated from the gate lines GL and the gate electrode GE. However, exemplary embodiments of the present invention are not limited thereto.

The active pattern layer APL, the first metal pattern layer MPL1 including the gate lines GL and the gate electrode GE, and the second metal pattern layer MPL2 including the data lines DL and the source/drain electrode DE may form a thin-film transistor. One transistor may be included per unit sensing area UIA; however, exemplary embodiments of the present invention are not limited thereto. A plurality of switching transistors and a plurality of sensing transistors may be arranged to correspond to one unit sensing area UIA.

Referring to FIGS. 3 and 4, the active pattern layer APL, the first metal pattern layer MPL1 including the gate lines GL, and the second metal pattern layer MPL2 including the data lines DL may be sequentially stacked in the stated order. However, exemplary embodiments of the present invention are not limited thereto, and the active pattern layer APL can be disposed on the gate lines GL, or the stacking order of the gate lines GL and the data lines DL may be changed. For example, the stacking order is not limited to a particular order.

Figure 5:
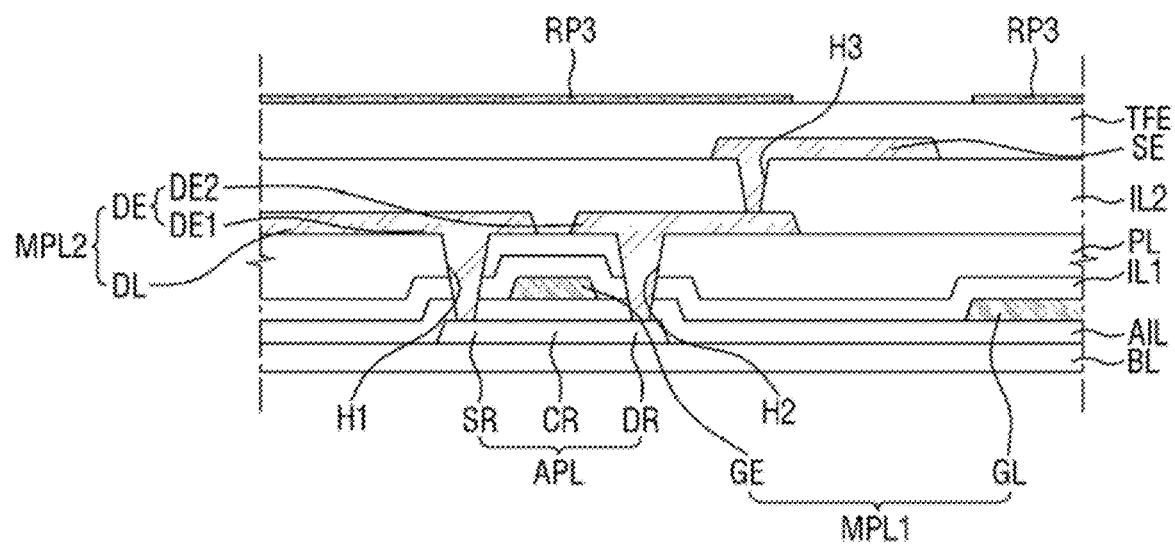
FIG. 5 is a cross-sectional view of an input sensing unit of a display device according to an exemplary embodiment of the present invention.

FIG. 5 is a cross-sectional view of an input sensing unit of a display device according to an exemplary embodiment of the present invention.

The display device described with reference to FIG. 5 is substantially the same as the display device described above with reference to FIGS. 2 through 4, except that an anti-reflection pattern layer RP3 is separated from first and second metal pattern layers MPL1 and MPL2. Thus, duplicative descriptions may be omitted below.

Referring to FIG. 5, the anti-reflection pattern layer RP3 may be positioned above the first and second metal pattern layers MPL1 and MPL2 and may be separated from the first and second metal pattern layers MPL1 and MPL2. The anti-reflection pattern layer RP3 may have a pattern overlapping the first and second metal pattern layers MPL1 and MPL2 disposed under the anti-reflection pattern layer RP3 along the direction orthogonal to the upper surface of the base layer BL. The anti-reflection pattern layer RP3 may be disposed on an encapsulation layer TFE in FIG. 5; however, exemplary embodiments of the present invention are not limited thereto. For example, the anti-reflection pattern layer RP3 may be disposed on any layer that is positioned above and separated from the first and second metal pattern layers MPL1 and MPL2.

Since the anti-reflection pattern layer RP3 is not formed on the surfaces of the first metal pattern layer MPL1 and the second metal pattern layer MPL2 but is formed as a single separate layer, process efficiency can be increased.

FIGS. 6 through 14 are cross-sectional views illustrating a method of manufacturing an input sensing unit according to an exemplary embodiment of the present invention.

Figure 6:
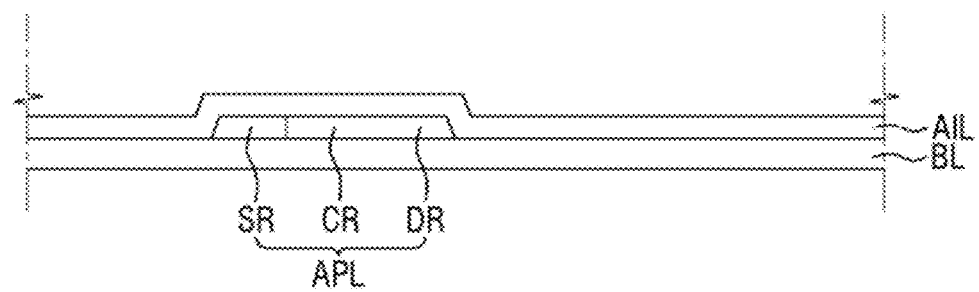
FIGS. 6 through 14 are cross-sectional views illustrating a method of manufacturing an input sensing unit according to an exemplary embodiment of the present invention.

Referring to FIG. 6, the active insulating layer AIL may be formed on the base layer BL having the active pattern layer APL to cover the active pattern layer APL.

Figure 7:
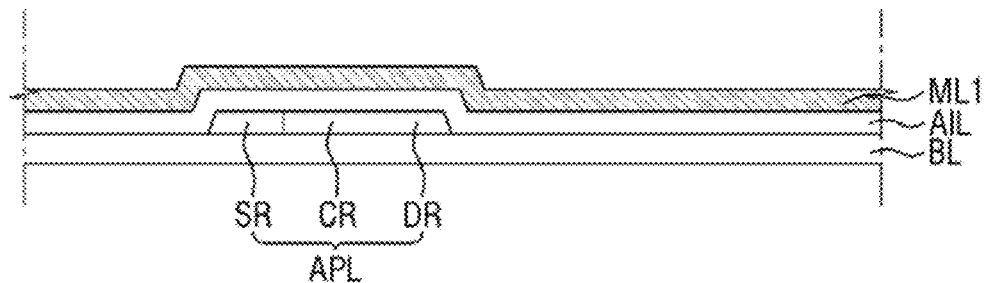

Referring to FIG. 7, a first metal layer ML1 may be formed on the active insulating layer AIL. The first metal layer ML1 may include a same material as the first metal pattern layer MPL1 described in more detail above.

Figure 8:
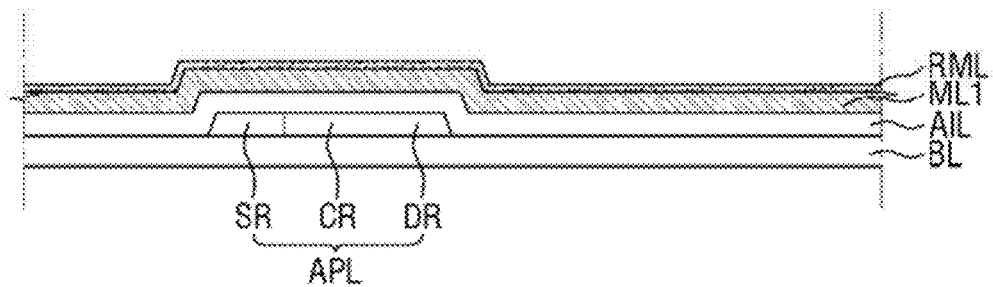

Referring to FIG. 8, an anti-reflection material layer RML may be formed on the first metal layer ML1 to cover the first metal layer ML. The anti-reflection material layer RML may include a metal oxide having an empirical formula of $Mo_aX_bO_c$. Since the metal oxide having the empirical formula has been described above in relation to the first and second anti-reflection pattern layers RP1 and RP2, duplicative descriptions may be omitted below.

Figure 9:
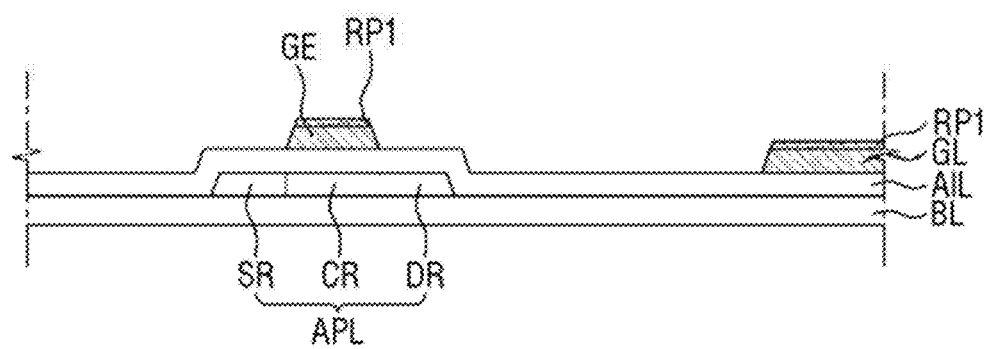

Referring to FIG. 9, the first metal layer ML1 and the anti-reflection material layer RML may be substantially simultaneously etched to form the first metal pattern layer MPL1 and the first anti-reflection pattern layer RP1. Wet etching or dry etching may be used as an etching method. For example, when wet etching is used, an occurrence of erosion can be reduced or eliminated because the metal oxide having the above empirical formula has relatively low solubility in water.

The first metal pattern layer MPL1 may include a plurality of gate lines GL and the gate electrode GE, and the first anti-reflection pattern layer RP1 may have the same pattern as the first metal pattern layer MPL1.

Figure 10:
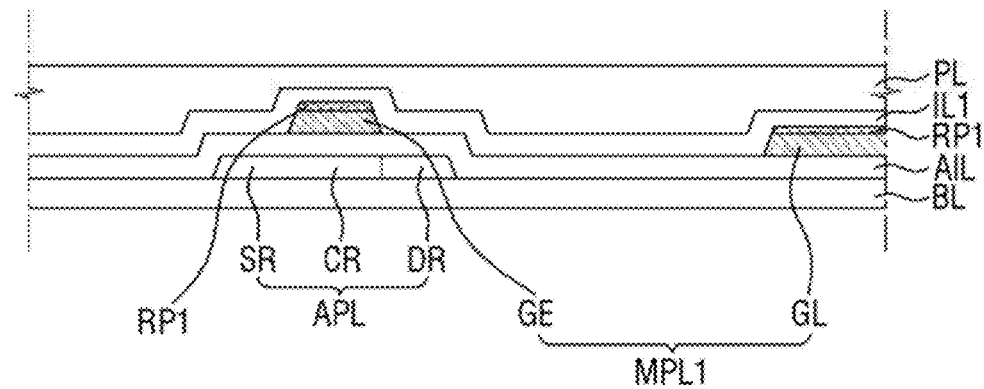

Referring to FIG. 10, the first insulating layer IL1 may be formed on the active insulating layer AIL to cover the first metal pattern layer MPL1 and the first anti-reflection pattern layer RP1. Referring to FIG. 10, the planarization film PL is also formed on the first insulating layer IL1. However, the planarization film PL may be omitted.

Figure 11:
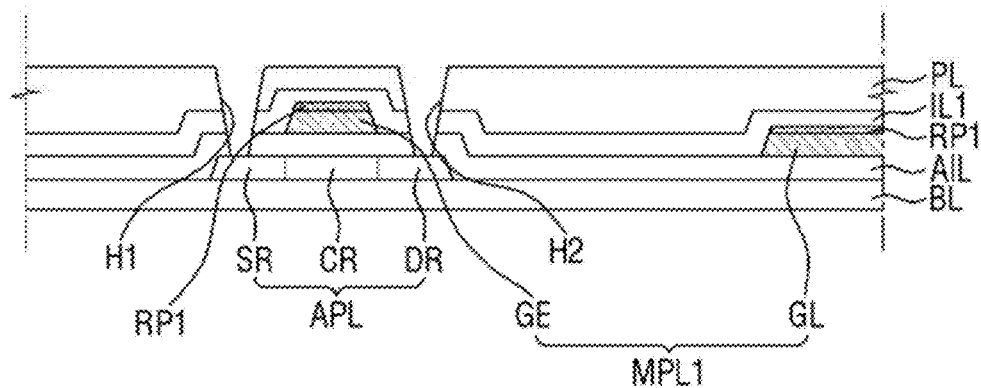

Referring to FIG. 11, a plurality of contact holes H1 and H2 may be formed in the active insulating layer AIL and the first insulating layer IL1. The contact holes H1 and H2 may be formed to pass through the active insulation layer AIL and the first insulation layer IL1 and expose the source region SR and the drain region DR of the active pattern layer APL, respectively. Referring to FIG. 11, the contact holes H1 and H2 may also be formed in the planarization film PL.

Figure 12:
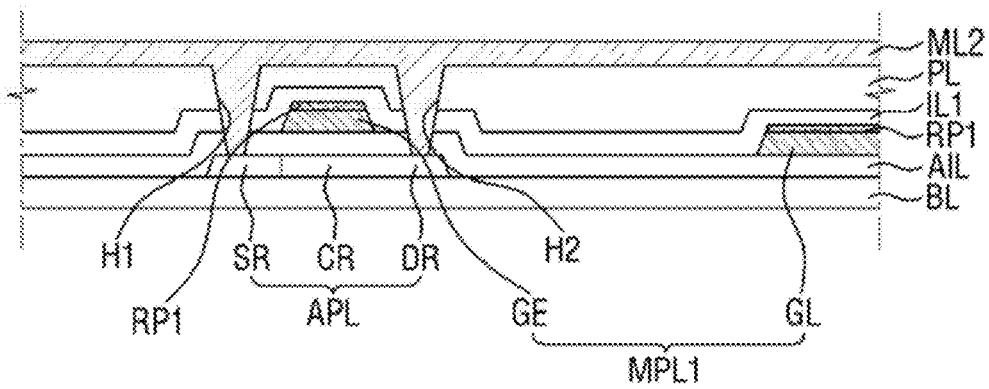

Referring to FIG. 12, a second metal layer ML2 may be formed on the first insulating layer IL1. The second metal layer ML2 may include a same material as the second metal pattern layer MPL2 described in more detail above. A portion of the second metal layer ML2 may fill the contact holes H1 and H2. Thus, the second metal layer ML2 may be electrically connected to the active pattern layer APL.

Figure 13:
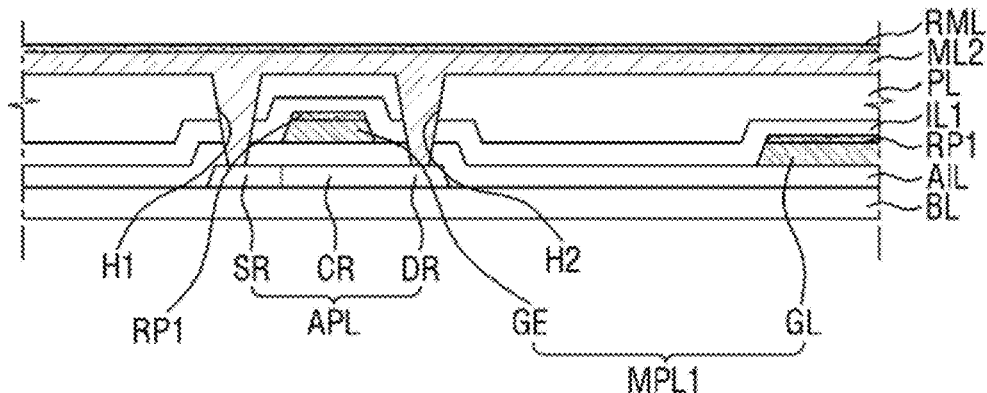

Referring to FIG. 13, an anti-reflection material layer RML may be formed on the second metal layer ML2 to cover the second metal layer ML2. The anti-reflection material layer RML may include a same material as the anti-reflection material layer RML formed on the first metal layer ML1 and described in more detail above.

Figure 14:
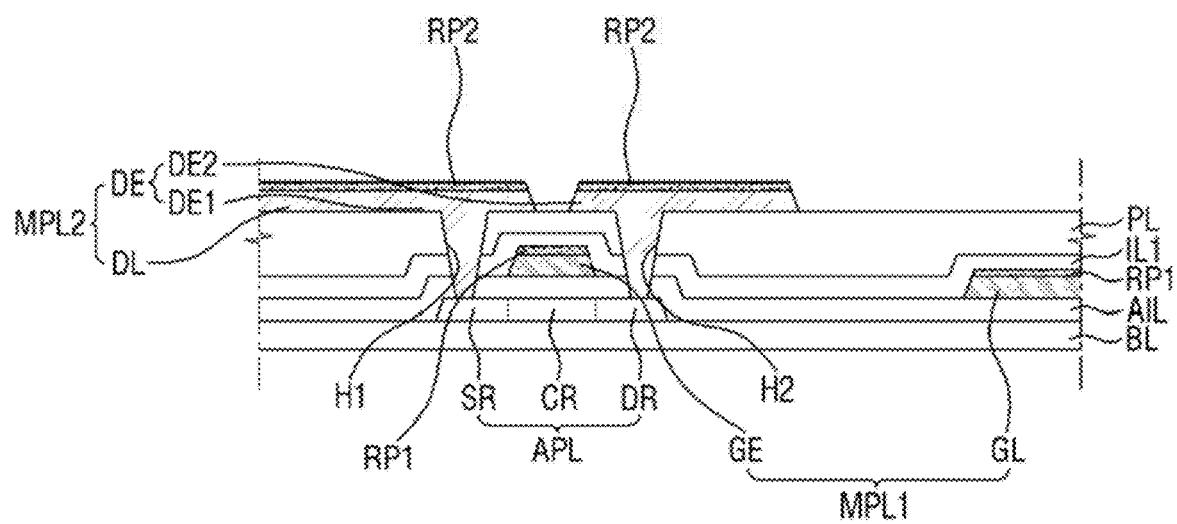

Referring to FIG. 14, the second metal layer ML2 and the anti-reflection material layer RML may be substantially simultaneously etched to form a second metal pattern layer MPL2 and the second anti-reflection pattern layer RP2. The second metal pattern layer MPL2 may include a plurality of data lines DL and the source/drain electrode DE. Wet etching or dry etching may be used as an etching method, and the second anti-reflection pattern layer RP2 may have a same pattern as the second metal pattern layer MPL2 described above in more detail.

The second insulating layer IL2, the sensing electrode SE, and the encapsulation layer TFE may be formed to produce the input sensing unit ISU1 described above with reference to FIG. 4.

Figure 15:
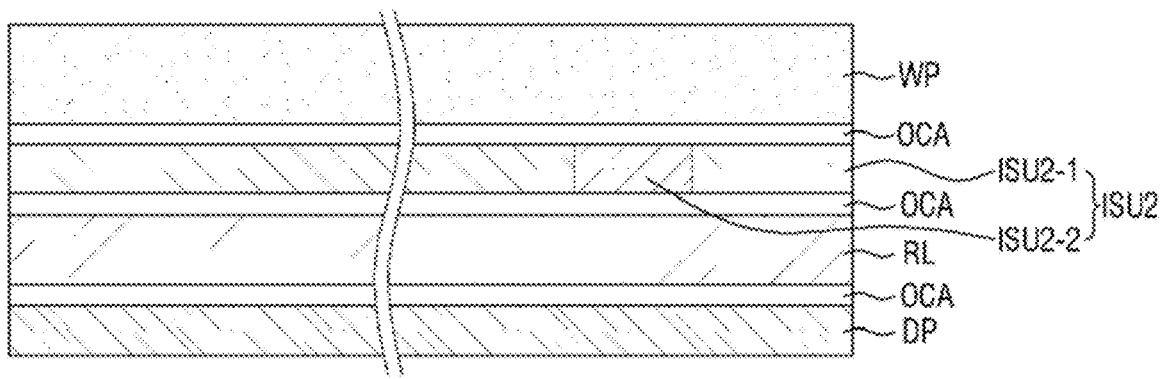
FIG. 15 is a cross-sectional view illustrating a stacked structure of a display device according to an exemplary embodiment of the present invention.
Figure 16:
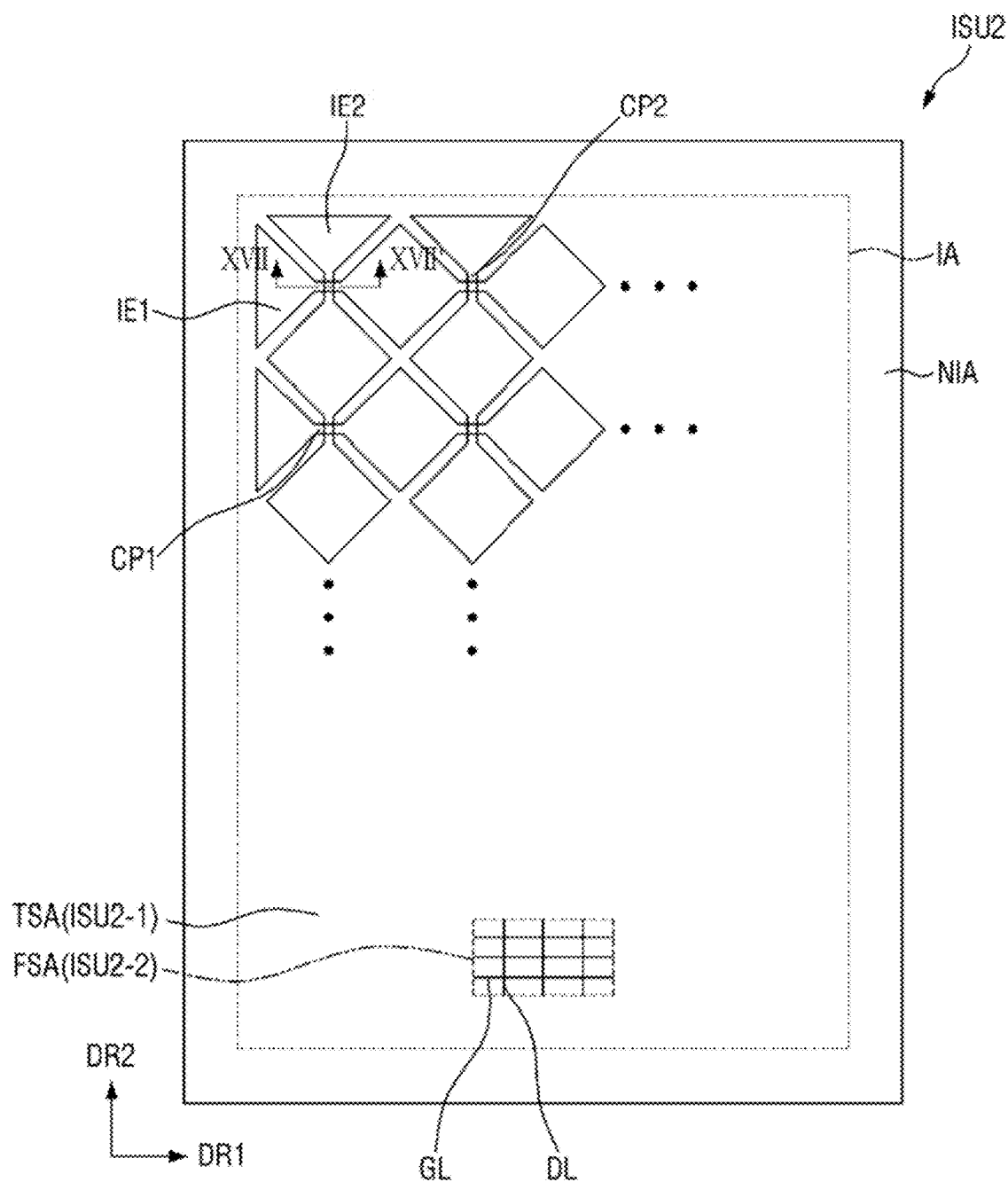
FIG. 16 is a plan view of an input sensing unit of the display device of FIG. 15.
Figure 17:
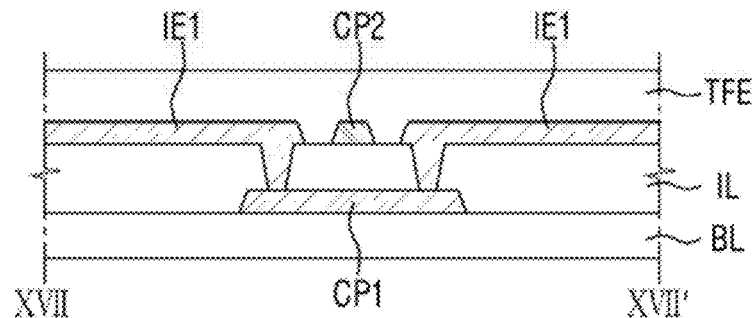
FIG. 17 is a cross-sectional view of the input sensing unit, taken along the line XVII-XVII' of FIG. 16.

FIG. 15 is a cross-sectional view illustrating a stacked structure of a display device according to an exemplary embodiment of the present invention. FIG. 16 is a plan view of an input sensing unit of the display device of FIG. 15. FIG. 17 is a cross-sectional view of the input sensing unit, taken along the line XVII-XVII' of FIG. 16.

The display device described with reference to FIGS. 15 through 17 is substantially the same as the display device described with reference to FIGS. 1 through 4 above, except that an input sensing unit ISU2 is divided into a touch sensing unit ISU2-1 and a fingerprint sensing unit ISU2-2. Thus, duplicative descriptions may be omitted below.

Referring to FIGS. 15 through 17, the input sensing unit ISU2 includes the fingerprint sensing unit ISU2-2 and the touch sensing unit ISU2-1. The fingerprint sensing unit ISU2-2 and the touch sensing unit ISU2-1 may be disposed on the same layer. When viewed from a plan view, the fingerprint sensing unit ISU2-2 may be positioned in a portion of the input sensing unit ISU2 to define a fingerprint sensing area FSA, and the touch sensing unit ISU2-1 may be positioned in another portion of the input sensing unit ISU2 to define a touch sensing area TSA. Referring to FIG. 16, the fingerprint sensing area FSA may be positioned in the lower center of the sensing area IA, and the touch sensing area TSA may be positioned in the remaining space of the sensing area IA to surround the fingerprint sensing area FSA. However, exemplary embodiments of the present invention are not limited thereto.

The fingerprint sensing unit ISU2-2 includes a plurality of unit sensing areas UIA defined by a plurality of gate lines GL and a plurality of data lines DL (see, e.g., FIG. 2). Since the fingerprint sensing unit ISU2-2 is substantially the same as that described above in more detail (see, e.g., FIG. 1), duplicative descriptions may be omitted below.

The touch sensing unit ISU2-1 may include a plurality of first sensing electrodes IE1 and a plurality of second sensing electrodes IE2. The first and second sensing electrodes IE1 and IE2 may be shaped like a plurality of diamonds connected in a line.

The first sensing electrodes IE1 and the second sensing electrodes IE2 may intersect each other. Each of the first sensing electrodes IE1 may include a first connection part CP1, and each of the second sensing electrodes IE2 may include a second connection part CP2.

Referring to FIG. 17, the touch sensing unit ISU2-1 may include the base layer BL, the first connection part CP1, an insulating layer IL, the sensing electrodes IE1 and IE2, and an encapsulation layer TFE stacked sequentially. The first sensing electrodes IE1 and the second sensing electrodes IE2 may be disposed on the same layer. The first connection part CP1 may be disposed on a layer separated from the first sensing electrodes IE1 by the insulating layer IL and may connect the first sensing electrodes IE1 to each other. The second connection part CP2 may be disposed on the same layer as the second sensing electrodes IE2 and may connect the second sensing electrodes IE2 to each other.

Like the sensing electrodes SE described above, the first sensing electrodes IE1 and the second sensing electrodes IE2 may include a transparent conductive material and may each be formed as a single layer or a multilayer.

The diamond shape of each of the first and second sensing electrodes IE1 and IE2 may be wider than each sensing electrode SE of the fingerprint sensing unit ISU2-2 or each unit sensing area UIA of the fingerprint sensing area FSA.

When the fingerprint sensing unit ISU2-2 is positioned only in an area for fingerprint detection and the general touch sensing unit ISU2-1 is positioned in other areas (see, e.g., FIGS. 15 through 17), the amount of material for manufacturing a thin-film transistor can be reduced.

Figure 18:
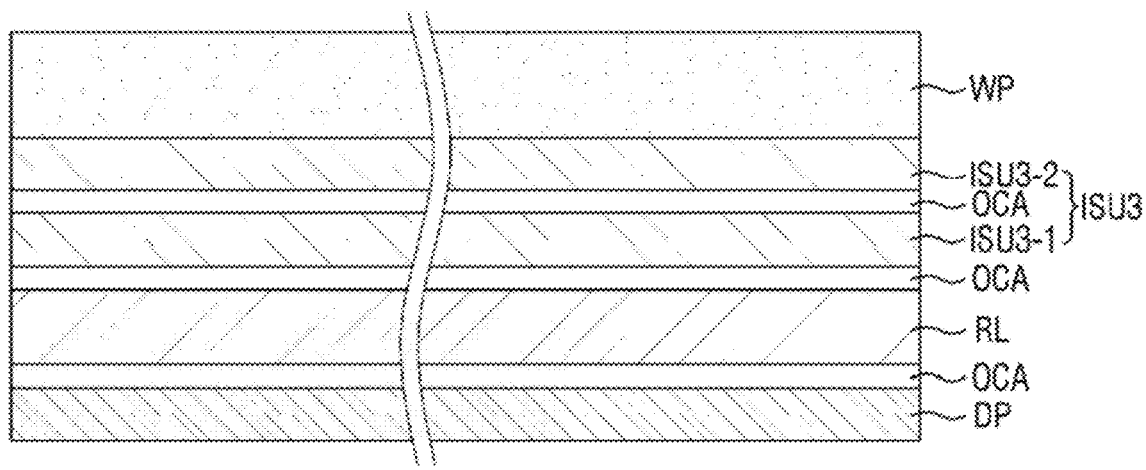
FIGS. 18 and 19 are cross-sectional views illustrating stacked structures of a display device according to an exemplary embodiment of the present invention.
Figure 19:
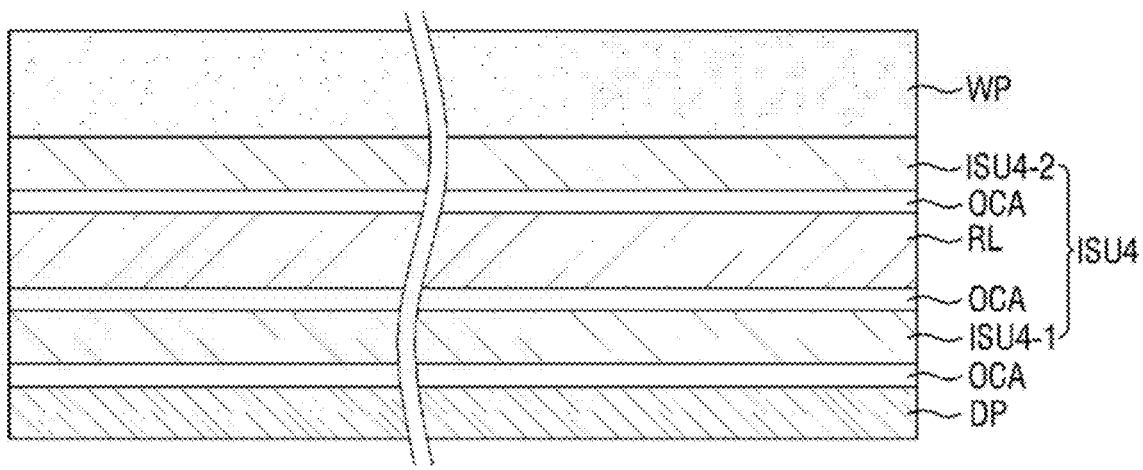

FIGS. 18 and 19 are cross-sectional views illustrating stacked structures of a display device according to an exemplary embodiment of the present invention.

The display device described with reference to FIG. 18 is substantially the same as the display device described above with reference to FIGS. 15 through 17, except that a fingerprint sensing unit ISU3-2 is disposed on a touch sensing unit ISU3-1 as a separate layer. Thus, duplicative descriptions may be omitted below.

Referring to FIG. 18, the display device may include an input sensing unit ISU3 including the touch sensing unit ISU3-1 and the fingerprint sensing unit ISU3-2 attached onto the touch sensing unit ISU3-1 by an adhesive member OCA. The fingerprint sensing unit ISU3-2 may be positioned in only a part of a sensing area IA when viewed in a plan view.

When the fingerprint sensing unit ISU3-2 is disposed as a separate layer from the touch sensing unit ISU3-1 (see, e.g., FIG. 18), a manufacturing process of the display device may be simplified and manufacturing costs may be reduced.

The touch sensing unit ISU3-1 may include a separate base layer. However, the separate base layer can be omitted, and an upper surface of an anti-reflection layer RL can be defined as a base surface of the touch sensing unit ISU3-1.

The display device described with reference to FIG. 19 is substantially the same as the display device described above with reference to FIG. 18, except that a touch sensing unit ISU4-1 is disposed under an anti-reflection layer RL. Thus, duplicative descriptions may be omitted below.

Referring to FIG. 19, an input sensing unit ISU4 may include the touch sensing unit ISU4-1 and a fingerprint sensing unit ISU4-2 disposed on different layers from each other. The touch sensing unit ISU4-1 may be positioned under the anti-reflection layer RL, and the fingerprint sensing unit ISU4-2 may be disposed on the anti-reflection layer RL.

Since the touch sensing unit ISU4-1 can operate with an acquisition of relatively less precise coordinate information than the fingerprint sensing unit ISU4-2, it is possible to acquire sufficient touch information even if the anti-reflection layer RL is disposed on the touch sensing unit ISU4-1.

Thus, when the touch sensing unit ISU4-1 is positioned under the anti-reflection layer RI. (see, e.g., FIG. 19), the reflection of external light by metallic elements included in the touch sensing unit ISU4-1 can be effectively blocked without an additional component.

The touch sensing unit ISU4-1 may include a separate base layer. However, the separate base layer can be omitted, and an upper surface of a display panel DP can be defined as a base surface of the touch sensing unit ISU4-1.

Examples of reflectance measurements of a metal coated with an anti-reflective material according to an exemplary embodiment of the present invention will be described below.

Example 1

Molybdenum may be coated with a metal oxide having an empirical formula of $Mo_aTa_bO_c$ to different thicknesses of from 400 Å to 650 Å. Then, the average reflectance of the resultant structure and the reflectance of the resultant structure for 550 nm may be simulated using a software tool. Here, a, b, and c represent the proportions of molybdenum, tantalum, and oxygen atoms and may be set to stoichiometrically appropriate values. As an example, the proportion of the tantalum atoms may be set to a value within the range of 1% to 7%.

Figure 20:
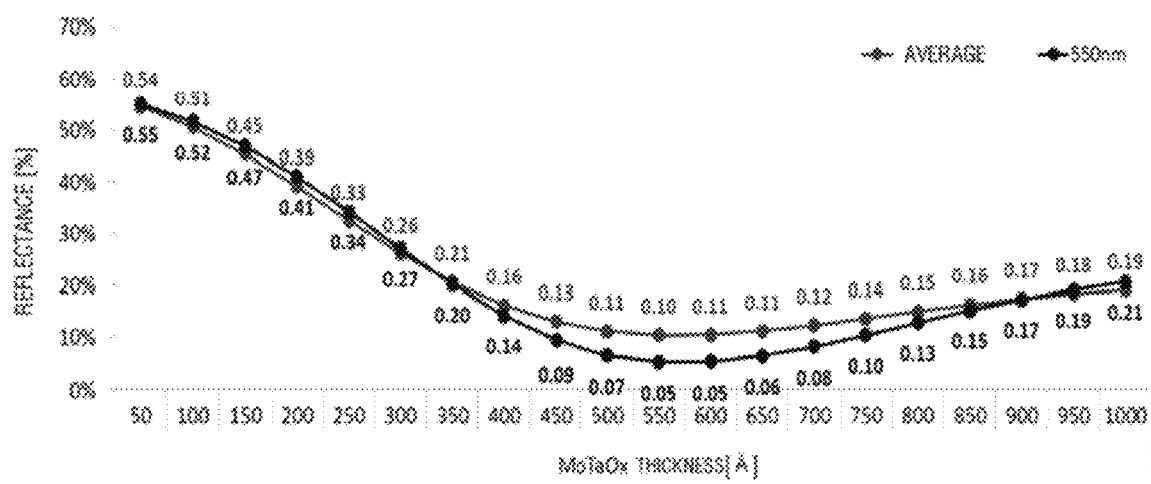
FIG. 20 is a graph illustrating exemplary reflectance measurements.

FIG. 20 is a graph illustrating exemplary reflectance measurements. Referring to FIG. 20, it can be seen that the optimum reflectance reduction effect is exhibited when the thickness of the metal oxide is within the range of from about 300 Å to about 700 Å. If the above structure is applied to a display device, the reflectance reduction effect by a refractive index matching layer such as $SiO_2$ is added. Thus, a reflectance of less than about 10% can be expected.

Example 2

A molybdenum layer having a thickness of about 2500 Å may be coated with the metal oxide of Experimental Example 1 to different thicknesses of from 350 Å to 750 Å. Then, the average reflectance of the resultant structure and the reflectance of the resultant structure for 550 nm may be measured. The composition of each element in the metal oxide having the above empirical formula can be analyzed using energy dispersive X-ray spectroscopy (EDS), X-ray photoelectron spectroscopy (XPS), secondary ion mass spectroscopy (SIMS), or auger electron spectroscopy (AES).

Figure 21:
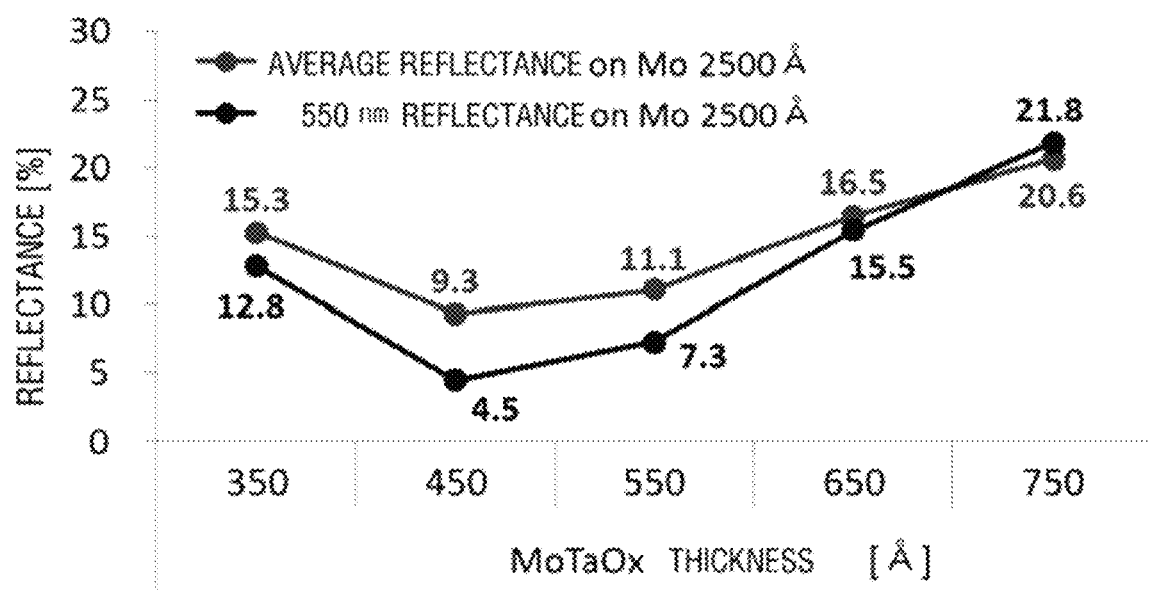
FIG. 21 is a graph illustrating exemplary reflectance measurements.

FIG. 21 is a graph illustrating exemplary reflectance measurements. Referring to FIG. 21, when the thickness of the metal oxide is within the range of about 300 Å to about 700 Å, the optimum reflectance reduction effect is exhibited. In addition, the variation in reflectance according to thickness is similar to the exemplary simulation result.

Example 3

The metal oxide of Experimental Example 1 may be coated to a thickness of about 450 Å on each of a molybdenum layer, an aluminum layer, and a titanium/aluminum/titanium multilayer. Then, the reflectance of each resultant structure according to wavelength may be measured.

Figure 22:
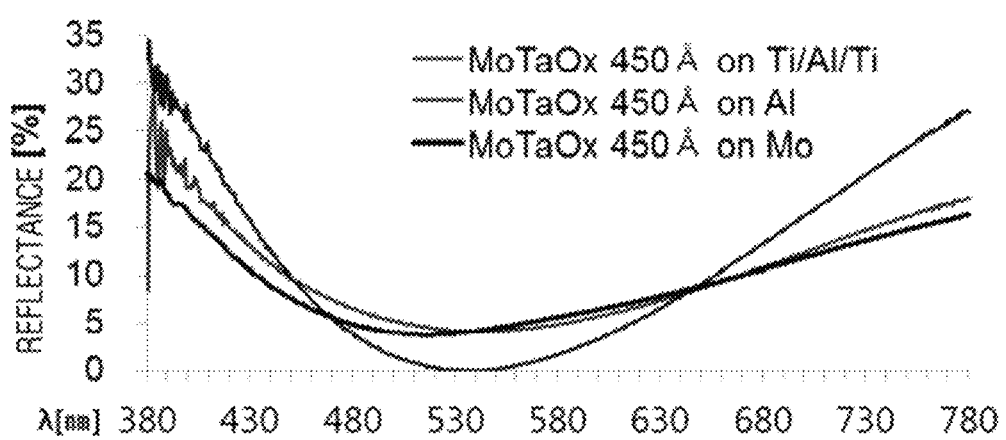
FIG. 22 is a graph illustrating exemplary reflectance measurements.
Figure 23:
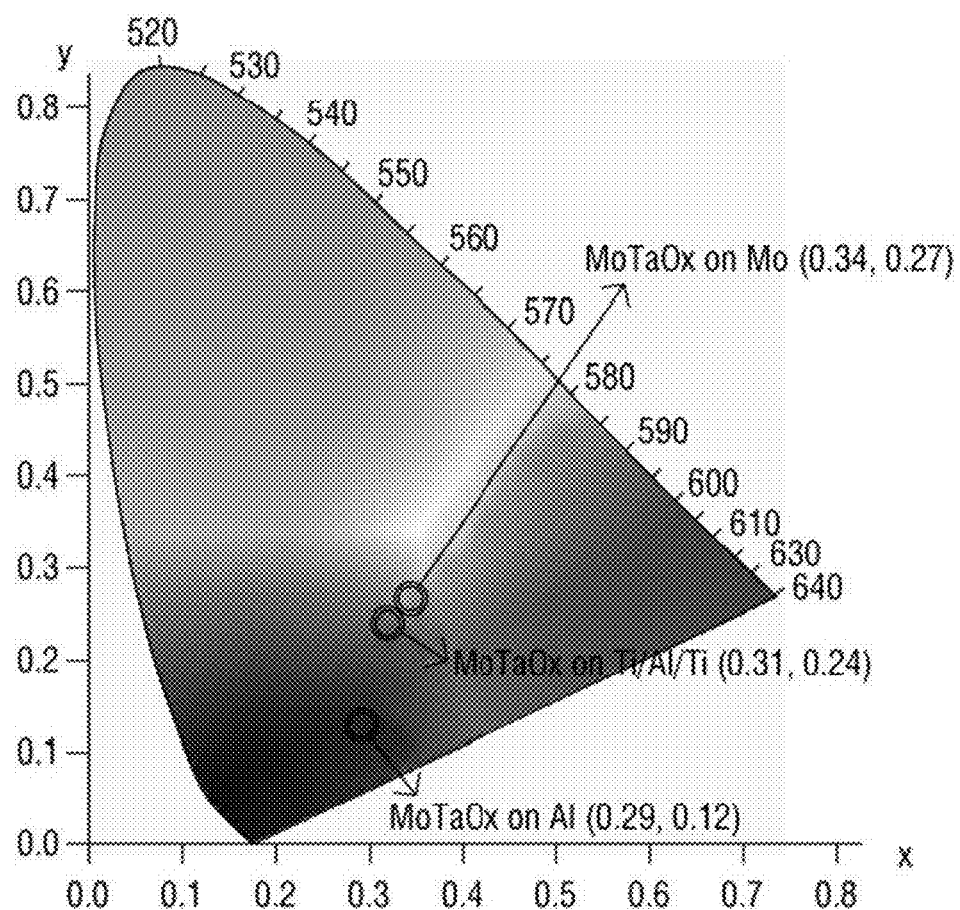
FIG. 23 illustrates color coordinates of coated structures based on reflectance according to wavelength.

FIG. 22 is a graph illustrating exemplary reflectance measurements. FIG. 23 illustrates color coordinates of coated structures based on reflectance according to wavelength.

Referring to FIG. 22, when the metal oxide is coated, the reflection reduction effect is greater as the wavelength is closer to about 550 nm, which is a wavelength most sensitive to the human eye. The structure formed by coating molybdenum with the metal oxide is closest to the center of the color coordinate system and thus least takes on a color.

According to an exemplary embodiment of the present invention, an anti-reflection pattern layer is formed on metal pattern layers included in an input sensing unit. Thus, the reflectance of the input sensing unit and a display device including the input sensing unit can be reduced to a level lower than 10%.

While the invention has been particularly shown and described with reference to exemplary embodiments thereof, it will be understood by those of ordinary skill in the art that various changes in provide form and detail may be made therein without departing from the spirit and scope of the present invention.

What is claimed is:

1. An input sensing unit comprising:
   a first metal pattern layer comprising a plurality of first conductive lines extending in a first direction;
   a first insulating layer disposed on the first metal pattern layer;
   a second metal pattern layer positioned above the first insulating layer and comprising a plurality of second conductive lines extending in a second direction intersecting the first direction;
   a second insulating layer disposed on the second metal pattern layer;
   a sensing electrode disposed on the second insulating layer and electrically connected to the second metal pattern layer through a contact hole defined in the second insulating layer; and
   an anti-reflection pattern layer disposed directly on an upper surface of the first and second metal pattern layers,
   wherein the anti-reflection pattern layer comprises a metal oxide having an empirical formula of $Mo_aX_bO_c$, where a and c are rational numbers greater than zero, b is a rational number greater than zero, and X includes at least one element selected from tantalum (Ta), vanadium (V), niobium (Nb), zirconium (Zr), tungsten (W), hafnium (Hf), titanium (Ti), or rhenium (Re), wherein a proportion of X atoms in the metal oxide is from 1% to 7%.

2. The input sensing unit of claim 1, wherein the anti-reflection pattern layer has a thickness of from 300 Å to 700 Å.

3. The input sensing unit of claim 1, wherein at least one of the first and second metal pattern layers comprises at least one of molybdenum (Mo), aluminum (Al), or titanium (Ti).

4. The input sensing unit of claim 1, wherein at least one of the first and second insulating layers comprises at least one of silicon oxide ($SiO_x$), silicon nitride ($SiN_x$), silicon oxynitride ($SiO_xN_y$), titanium oxide ($TiO_2$), or aluminum oxide ($Al_2O_3$).

5. The input sensing unit of claim 1, further comprising:
an active pattern layer; and
an active insulating layer disposed on the active pattern layer,
wherein the first metal pattern layer is disposed on the active insulating layer, and part of each of the first and second metal pattern layers overlaps at least part of the active pattern layer along the direction orthogonal to the upper surface of the anti-reflection pattern layer.

6. The input sensing unit of claim 5, wherein the first metal pattern layer is disposed above the active pattern layer, and the second metal pattern layer is electrically connected to the active pattern layer.

7. The input sensing unit of claim 1, wherein the anti-reflection pattern layer is configured to electrically connect the sensing electrode to the second metal pattern layer.

8. A display device comprising:
a display panel on which a plurality of pixels are defined;
an anti-reflection layer disposed on the display panel; and
an input sensing unit disposed on the anti-reflection layer,
wherein the input sensing unit comprises:
a first metal pattern layer comprising a plurality of first conductive lines extending in a first direction;
a second metal pattern layer positioned above the first metal pattern layer and comprising a plurality of second conductive lines extending in a second direction intersecting the first direction; and
an anti-reflection pattern layer disposed directly on an upper surface of the first and second metal pattern layers,
wherein the anti-reflection pattern layer comprises a metal oxide having an empirical formula of $Mo_aX_bO_c$, where a and c are rational numbers greater than zero, b is a rational number greater than zero, and X includes at least one element selected from tantalum (Ta), vanadium (V), niobium (Nb), zirconium (Zr), tungsten (W), hafnium (Hf), titanium (Ti), or rhenium (Re),
wherein a proportion of X atoms in the metal oxide is from 1% to 7%.

9. The display device of claim 8, wherein the first and second metal pattern layers do not overlap the pixels along the direction orthogonal to the upper surface of the anti-reflection pattern layer.

10. The display device of claim 8, wherein a plurality of unit sensing areas are defined in the input sensing unit, wherein each of the unit sensing areas overlaps 1 to 30 pixels of the plurality of pixels along the direction orthogonal to the upper surface of the anti-reflection pattern layer.

11. The display device of claim 8, wherein the anti-reflection layer comprises a polarizer.

12. The display device of claim 8, wherein the input sensing unit further comprises an active pattern layer, wherein the first metal pattern layer is disposed on the active pattern layer, and part of each of the first and second metal pattern layers overlaps at least part of the active pattern layer along the direction orthogonal to the upper surface of the anti-reflection pattern layer.

13. The display device of claim 12, wherein the first metal pattern layer is disposed above the active pattern layer, and the second metal pattern layer is electrically connected to the active pattern layer.

14. The display device of claim 8, wherein the anti-reflection pattern layer has a thickness of from 300 Å to 700 Å.

15. The display device of claim 8, further comprising:
a window layer disposed on the input sensing unit; and
an adhesive member which disposed between the input sensing unit and the window layer to attach the window layer to the input sensing unit.

16. A method of manufacturing an input sensing unit, the method comprising:
forming an active pattern layer and an active insulating layer which substantially covers the active pattern layer on a base layer;
forming a first metal layer and an anti-reflection material layer which substantially covers the first metal layer on the active insulating layer;
forming a first metal pattern layer which comprises a plurality of first conductive lines extending in a first direction and a first anti-reflection pattern layer which has the same pattern as the first metal pattern layer by substantially simultaneously etching the first metal layer and the anti-reflection material layer;
forming a first insulating layer on the active insulating layer to substantially cover the first metal pattern layer and the first anti-reflection pattern layer;
forming a second metal layer and an anti-reflection material layer which substantially covers the second metal layer on the first insulating layer; and
forming a second metal pattern layer comprising a plurality of second conductive lines extending in a second direction intersecting the first direction and a second anti-reflection pattern layer which has the same pattern as the second metal pattern layer by substantially simultaneously etching the second metal layer and the anti-reflection material layer,
wherein part of the first metal pattern layer overlaps at least part of the active pattern layer along a direction orthogonal to an upper surface of the base layer, and part of the second metal pattern layer overlaps at least part of the active pattern layer along the direction orthogonal to the upper surface of the base layer,
wherein the anti-reflection material layer comprises a metal oxide having an empirical formula of $Mo_aX_bO_c$, where a and c are rational numbers greater than zero, b is a rational number equal to or greater than zero, and X includes at least one element selected from tantalum (Ta), vanadium (V), niobium (Nb), zirconium (Zr), tungsten (W), hafnium (Hf), titanium (Ti), or rhenium (Re).

17. The method of claim 16, further comprising:
forming a second insulating layer on the first insulating layer to cover the second metal pattern layer and the second anti-reflection pattern layer;
forming a contact hole in the second insulating layer to partially expose the second metal pattern layer or the second anti-reflection pattern layer; and
forming a sensing electrode, which is electrically connected to the second metal pattern layer through the contact hole, on the second insulating layer.

18. The method of claim 16, wherein a proportion of X atoms in the metal oxide is from 1% to 7%.

19. The method of claim 16, wherein at least one of the first and second metal pattern layers comprises at least one of molybdenum (Mo), aluminum (Al), or titanium (Ti).

20. The method of claim 16, wherein at least one of the first and second insulating layers comprises at least one of silicon oxide ($SiO_x$), silicon nitride ($SiN_x$), silicon oxynitride ($SiO_xN_y$), titanium oxide ($TiO_2$), or aluminum oxide ($Al_2O_3$).

* * * * *